US006774614B2

United States Patent
Sahm, III et al.

(10) Patent No.: US 6,774,614 B2
(45) Date of Patent: Aug. 10, 2004

(54) METHOD AND APPARATUS FOR DETECTING CURRENT

(75) Inventors: William Herbert Sahm, III, Argyle, NY (US); Stanley A. Miske, Jr., deceased, late of Clifton Park, NY (US); by Carol Conde Miske, legal representative, Raleigh, NC (US); Daniel Herbert Baker, Cambridge, NY (US); Bruce Edward English, Saratoga Springs, NY (US); John Michael Kern, Gansevoort, NY (US)

(73) Assignee: General Electric Company, Schnectady, NY (US)

(*) Notice: Subject to any disclaimer, the term of this patent is extended or adjusted under 35 U.S.C. 154(b) by 0 days.

(21) Appl. No.: 10/083,841

(22) Filed: Feb. 27, 2002

(65) Prior Publication Data

US 2003/0160600 A1 Aug. 28, 2003

(51) Int. Cl.$^7$ ............................................. G01R 23/02
(52) U.S. Cl. .......................... 324/76.39; 324/76.49; 361/20; 361/79; 361/113
(58) Field of Search .................... 324/66, 76.39, 324/76.49; 361/20, 79, 113, 182; 307/102, 105; 702/117, 190

(56) References Cited

U.S. PATENT DOCUMENTS

| 3,944,846 | A | 3/1976 | Thompson et al. | 307/129 |
| 4,106,071 | A | 8/1978 | Sun et al. | 361/113 |
| 4,125,884 | A | 11/1978 | Sun | 307/129 |
| 4,208,687 | A | 6/1980 | Sun et al. | 340/658 |
| 4,218,718 | A | 8/1980 | Sun | 361/113 |
| 4,384,246 | A | 5/1983 | Larsen et al. | 322/100 |
| 4,607,217 | A | 8/1986 | Bhargava | 322/29 |
| 5,262,677 | A | 11/1993 | Ramirez | 307/102 |
| 5,677,852 | A | 10/1997 | Juhlin | 702/117 |

Primary Examiner—N. Le
Assistant Examiner—Vincent Q. Nguyen
(74) Attorney, Agent, or Firm—Karl A. Vick, Esq.; Armstrong Teasdale LLP

(57) ABSTRACT

An apparatus for detecting currents in a three-phase power transmission system includes a first detection circuit electrically coupled to a first phase of the three-phase transmission system, a second detection circuit electrically coupled to a second phase of the three-phase transmission system different than the first phase, and an event output switch electrically coupled to the first detection circuit and the second detection circuit and configured to actuate when a subsynchronous current at least one of the first phase and the second phase exceeds a pre-selected subsynchronous current setpoint.

16 Claims, 5 Drawing Sheets

METHOD AND APPARATUS FOR DETECTING CURRENT

BACKGROUND OF THE INVENTION

This invention relates generally to an apparatus for detecting current and more specifically to an apparatus for detecting subsynchronous current in a high voltage transmission line.

At least some known high power transmission systems transmit a subsynchronous current along a transmission line. The subsynchronous current is a current which has a lower frequency than a normal transmission line frequency. The subsynchronous current is undesirable and when supplied to a power system generator may induce harmonic oscillations in a generator shaft that couples a prime mover to the generator. Harmonic oscillations are evident when series capacitor banks are utilized on a high voltage transmission line to increase a power flow capability. Electrical resonant frequencies of a series capacitor/transmission line system coupled a generator/shaft system may cause the harmonic oscillations to increase in intensity or magnitude. Continued operation with such oscillations and the associated shaft flexing may limit a useful life of the shaft.

To facilitate preventing subsynchronous current development, at least some known power transmission systems undergo extensive and expensive design reviews and testing prior to implementation. However, when a plurality of capacitor banks are coupled in series with the transmission lines, as is common in the proximity of generators, subsynchronous currents may develop when the capacitors are in service. Detecting appropriate levels of subsynchronous currents is difficult because the magnitude of troublesome subsynchronous current is very low compared to a nominal level of normal line frequency.

BRIEF DESCRIPTION OF THE INVENTION

In one aspect, an apparatus for detecting currents in a three-phase power transmission system is provided. The apparatus includes a first detection circuit electrically coupled to a first phase of the three-phase transmission system, a second detection circuit electrically coupled to a second phase of the three-phase transmission system different than the first phase, and an event output switch electrically coupled to the first detection circuit and the second detection circuit and configured to actuate when a subsynchronous current on at least one of the first phase and the second phase exceeds a pre-selected subsynchronous current setpoint.

In another aspect, a series capacitor bank for a three-phase power transmission system is provided. The capacitor bank includes a first detection circuit electrically coupled to a first phase of the three-phase transmission system, a second detection circuit electrically coupled to a second phase of the three-phase transmission system different than the first phase, and an event output switch electrically coupled to the first detection circuit and the second detection circuit and configured to actuate when a subsynchronous current on at least one of the first phase and the second phase exceeds a pre-selected subsynchronous current setpoint.

In a further aspect, a three-phase power transmission system is provided. The transmission system includes a series capacitor bank, a first detection circuit electrically coupled to a first phase of the three-phase transmission system, a second detection circuit electrically coupled to a second phase of the three-phase transmission system different than the first phase, and an event output switch electrically coupled to the first detection circuit and the second detection circuit and configured to actuate when a subsynchronous current on at least one of the first phase and the second phase exceeds a pre-selected subsynchronous current setpoint.

In a still further aspect, a method for detecting subsynchronous currents in a power transmission system is provide. The method includes installing at least one detection circuit proximate at least one generator, coupling the detection circuit to a phase of a three-phase transmission system, monitoring the phase for a subsynchronous current, and activating an event output switch when the subsynchronous current exceeds a pre-selected subsynchronous current setpoint.

DETAILED DESCRIPTION OF THE INVENTION

Figure 1:
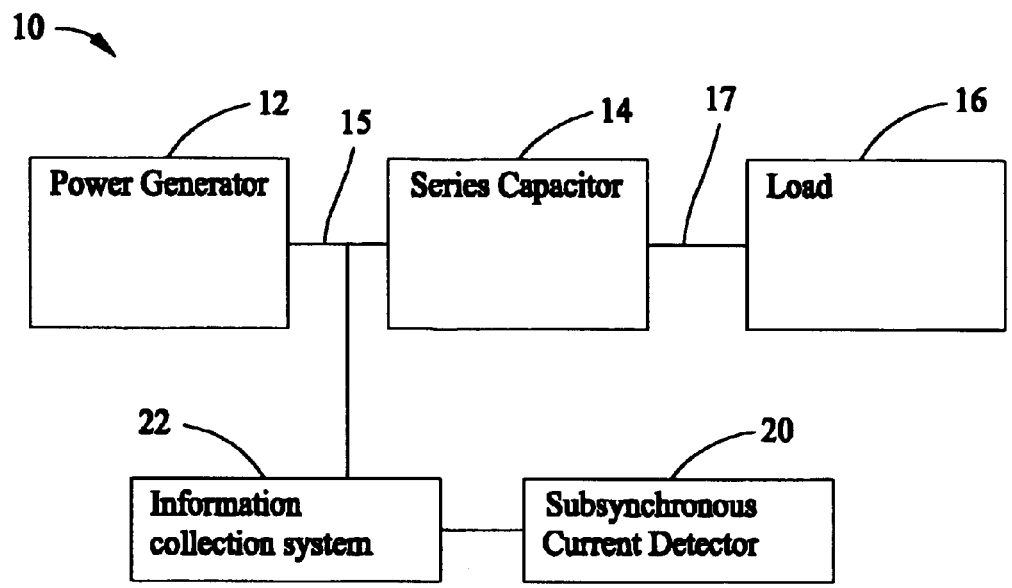
FIG. 1 is an illustration of a power transmission system.
Figure 2:
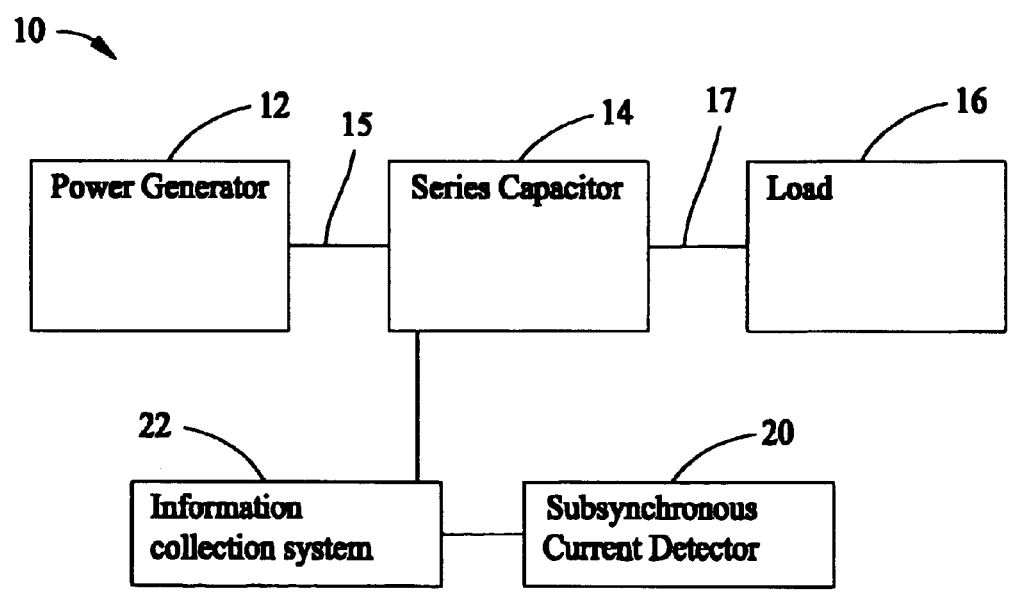
FIG. 2 is an illustration of another power transmission system.

FIG. 1 is one exemplary embodiment and FIG. 2 is another exemplary embodiment of a power transmission system 10. System 10 includes a power system generator 12 electrically coupled to a capacitor bank 14 through a transmission line 15. In one embodiment, capacitor bank 14 is a series capacitor bank. Capacitor bank 14 is electrically coupled to a load 16 through a transmission line 17. Referring to FIG. 1, system 10 also includes a subsynchronous current detector (SCD) 20 electrically coupled to at least one of a transmission line 15 and a transmission line 17 through an information collection system 22, such as, but not limited to, a General Electric Series Capacitor Protection System and a digital fault recorder (DFR). In one embodiment, transmission lines 15 and 17 are proximate to or included as a part of series capacitor bank 14. Referring to FIG. 2, system 10 also includes a subsynchronous current detector (SCD) 20 electrically coupled to series capacitor bank 14. In another embodiment, SCD 20 is positioned within series capacitor bank 14 and is electrically coupled to series capacitor bank 14. As described herein, SCD 20 can be electrically coupled to any phase of transmission lines 15 and 17 respectively.

Figure 3:
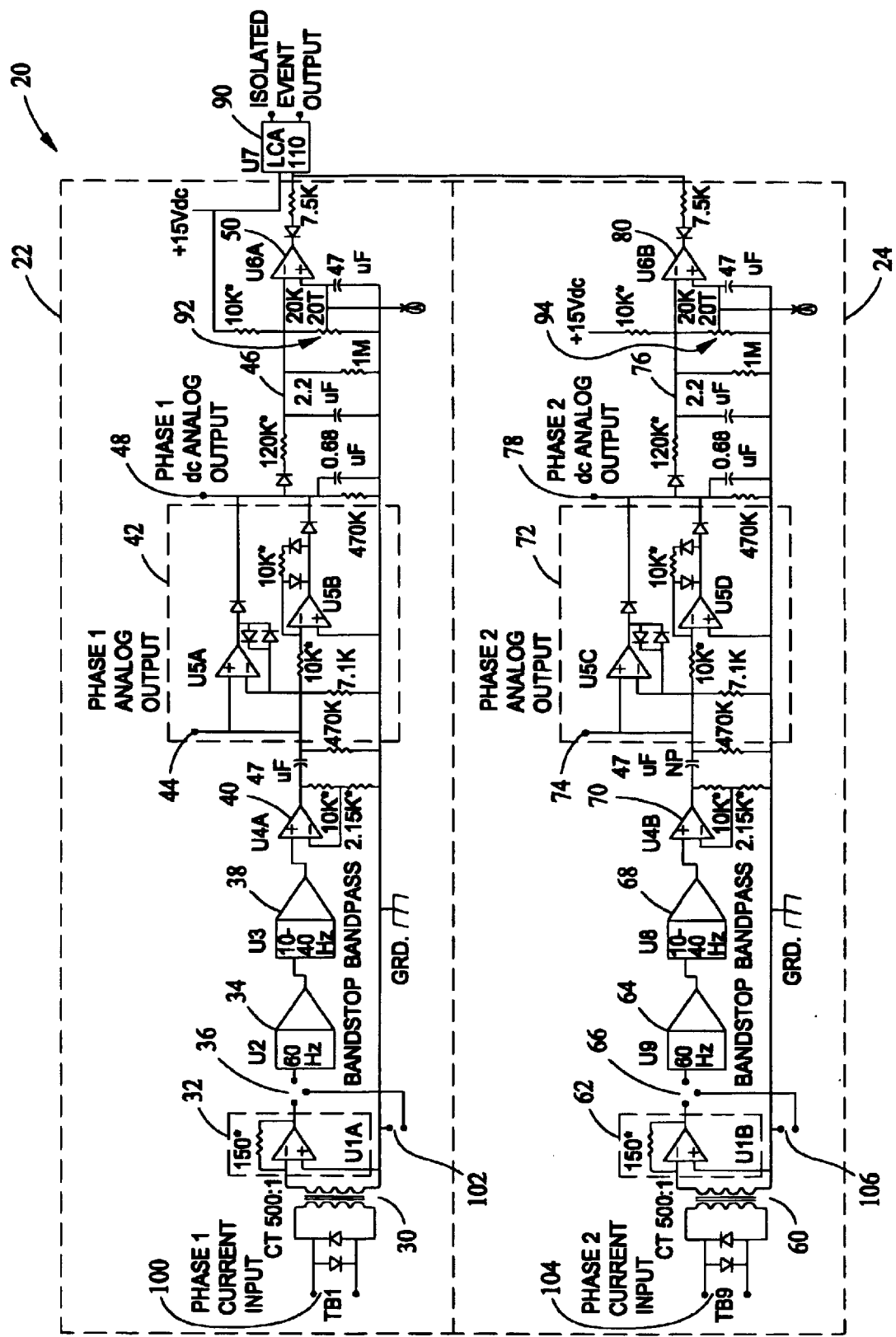
FIG. 3 is a schematic diagram of a subsynchronous current detector.

FIG. 3 is a schematic diagram of a SCD 20. In one embodiment SCD 20 is fabricated using analog signal processing circuitry. In another embodiment, SCD 20 is fabricated using digital signal processing circuitry. In the exemplary embodiment, SCD 20 includes a first phase detection circuit 22 and a second phase detection circuit 24. First phase detection circuit 22 includes a current transformer 30 electrically coupled to a transconductance amplifier 32. Transconductance amplifier 32 is electrically coupled to an analog bandstop filter 34 through a jumper select switch 36. Analog filter 34 output is input to an analog bandpass filter 38. Bandpass filter 38 output is input to an amplifier 40, that has an output that is input to a full-wave rectifier (FWR) 42 and also to an external output 44 as a phase one analog output signal. FWR 42 is input to a resistor/capacitor (RC) time delay circuit 46 and also to an external output 48 as a phase one direct current (DC) analog output signal, and then output to a comparator 50.

In use, a phase one voltage input or a phase one current input signal are supplied to SCB 20 through a current input connector 100 or a voltage input connector 102 based on compatibility with information collection system 18. The phase one current input is isolated and converted to a voltage using current transformer 30, and then scaled by transconductance amplifier 32 to generate a voltage output. An operator selects a compatible input type, i.e. phase one current or phase one voltage, by positioning jumper select switch 36 in a desired position. More specifically, if jumper select switch 36 is positioned such that a current input is desired then the transconductance amplifier output is transmitted through jumper select switch 36 to analog bandstop filter 34. Bandstop filter 34 facilitates suppressing a given range of frequencies and transmits only those frequencies that are above and below that band. Alternatively, if jumper select switch 36 is positioned such that a voltage input is desired, then the phase one voltage input is transmitted through jumper select switch 36 to analog bandstop filter 34. Analog bandstop filter 34 facilitates suppressing a line frequency ($f_0$) thereby removing approximately all of the power frequency component.

Bandstop filter 34 output is input to bandpass filter 38. Bandpass filter 38 outputs a signal that is high for a specific band of frequencies, but that falls to low values above and below the specified band band. In one embodiment, bandpass filter 38 operates in a band between approximately ($f_0/6$) and ($4f_0/6$) and generates approximately forty decibel (dB) gain at bandpass filter 38 output. Bandpass filter 38 output is input to an amplifier 40. In one embodiment, amplifier 40 generates approximately fifteen dB gain. Amplifier 40 output is input to FWR 42 and also to external output 44 as a phase one analog output signal. In one embodiment, the phase one analog output signal is used for DFR records. FWR 42 output is input to RC time delay circuit 46 and also to external output 48 as a phase one DC analog output signal which is compatible with a PLC analog input module requirement. RC time delay circuit 46 output is then input to comparator 50.

Second phase detection circuit 24 includes a current transformer 60 that is electrically coupled to a transconductance amplifier 62. Transconductance amplifier 62 is electrically coupled to an analog filter 64 through a jumper select switch 66. Analog filter 64 output is input to an analog bandpass filter 68. Bandpass filter 68 output is input to an amplifier 70. Amplifier 70 output is input to a FWR 72 and also to an external output 74 as a phase one analog output signal. FWR 72 is input to a RC time delay circuit 76 and also to an external output 78 as a phase one DC analog output signal, and then output to comparator 80.

In use, a phase two voltage input or a phase two current input signal are supplied to SCB 20 through a current input connector 104 or a voltage input connector 106. The phase two current input is isolated and converted to a voltage using current transformer 60, and then scaled by transconductance amplifier 62 to generate a voltage output. An operator selects an input signal type, i.e. phase two current or phase two voltage, by positioning jumper select switch 66 in a desired position. More specifically, if jumper select switch 66 is positioned such that a phase two current input is desired then the transconductance amplifier output is transmitted through jumper select switch 66 to analog bandstop filter 64. Bandstop filter 64 facilitates suppressing a given range of frequencies and transmits only those frequencies that are above and below that band. Alternatively, if jumper select switch 66 is positioned such that a voltage input is desired, then the phase two voltage input is transmitted through jumper select switch 66 to analog bandstop filter 64. Analog bandstop filter 64 facilitates suppressing a line frequency ($f_0$) thereby removing approximately all of the power frequency component.

Bandstop filter 64 output is input to bandpass filter 68. Bandpass filter 68 outputs a signal that is high for a specific band of frequencies, but that falls to low values above and below the specified band. In one embodiment, bandpass filter 68 operates in a band between approximately ($f_0/6$) and ($4f_0/6$) and generates approximately forty decibel (dB) gain at bandpass filter 68 output. Bandpass filter 88 output is input to an amplifier 70. In one embodiment, amplifier 70 generates approximately fifteen dB gain. Amplifier 40 output is input to FWR 72 and also to external output 74 as a phase one analog output signal. In one embodiment, the phase one analog output signal is used for DFR records. FWR 72 output is input to RC time delay circuit 76 and also to external output 78 as a phase one DC analog output signal which is compatible with a PLC analog input module requirement. RC time delay circuit 76 output is then input to comparator 80.

First phase detection circuit 22 and second phase detection circuit 24 are electrically coupled to an event output switch 90. Event output switch 90 is a solid state, normally open, dry contact switch that is compatible with a plurality of electrical or electronic monitoring and diagnostic equipment such as, but not limited to the DFR. Comparators 50 and 80 control event output switch 90. Event output switch 90, utilizes the RC time delayed FWR signal as a comparator input for DFR triggering. In use, event output switch 90 is activated when the inputs from either comparator 50 or comparator 80 exceed a pre-selected setting. In one embodiment, a potentiometer 92 is adjusted for a threshold level of output 42 and output 48, and a potentiometer 94 is adjusted for a threshold level of output 74 and output 78.

In the exemplary embodiment, SCD 20 is electrically coupled with at least one of transmission system 10 or series capacitor bank 20 and used to detect and monitor very low level frequency components that are less than the transmission line fundamental frequency in the line current. In one embodiment, SCD 20 is a stand-alone printed circuit board that is energized using either common utility alternating (AC) or DC voltage. SCD 20 is operable using either current or voltage signals derived from a transmission line current. In the exemplary embodiment, SCD 20 facilitates accurately extracting a plurality of lower frequencies contained in a band between approximately 17% and approximately 67% of nominal line frequency. In another embodiment, SCD 20 facilitates extracting a plurality of lower frequencies contained in a band between approximately 13% and approximately 83% of nominal line frequency. SCD 20 also provides at least one event signal 90 indicating a preset level has been exceeded. In use, SCD 20 monitors two phases of three-phase transmission line 16 and includes separate analog outputs for each monitored phase as described herein. SCD 20 is compatible with the GE Series Capacitor Protection System and a plurality of standalone substation DFR systems.

Figure 4A:
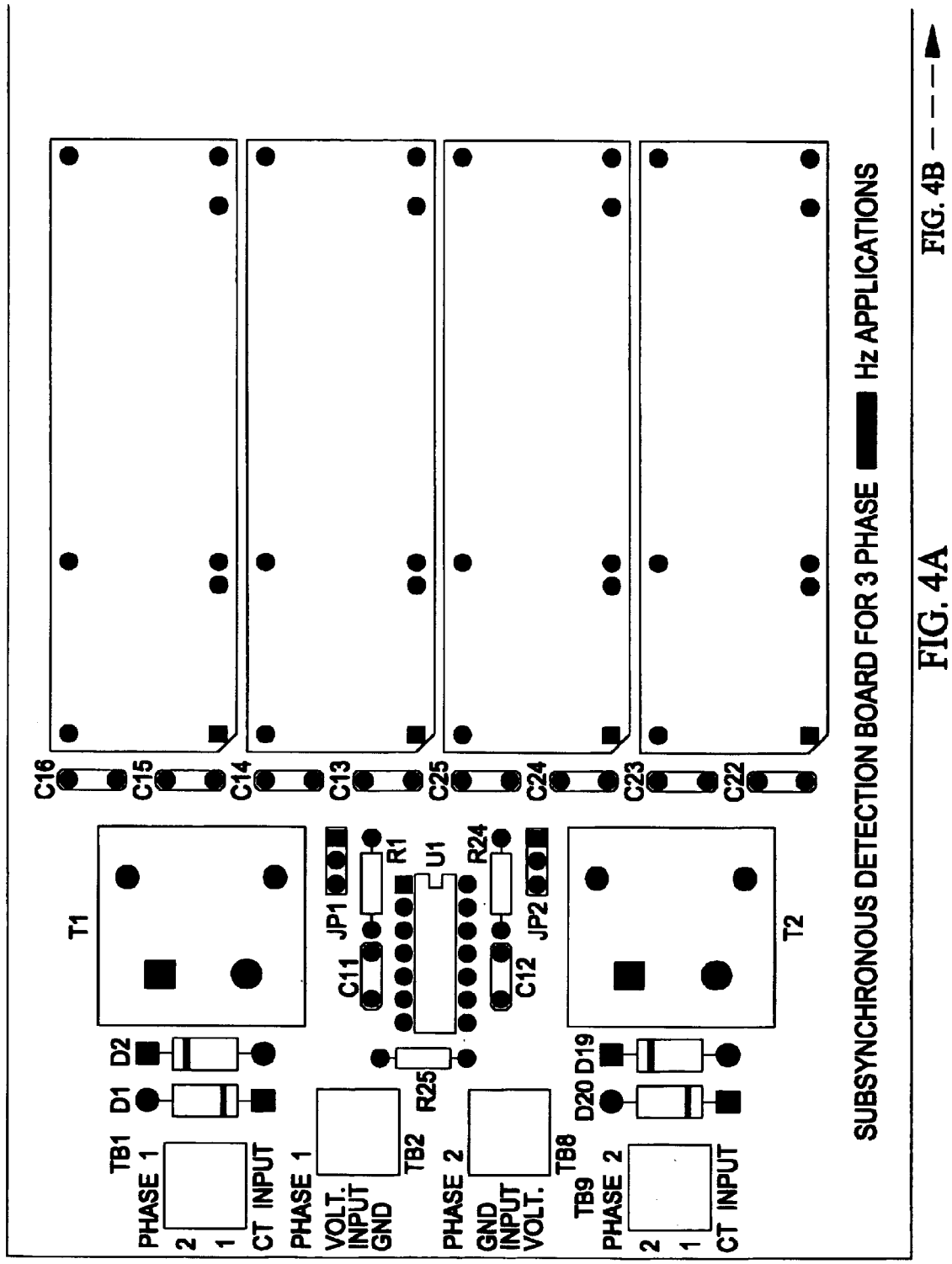
FIG. 4A is a first portion of an illustration of a printed circuit board layout that may be used to implement the schematic shown in FIG. 2.
Figures 4A, 4B:
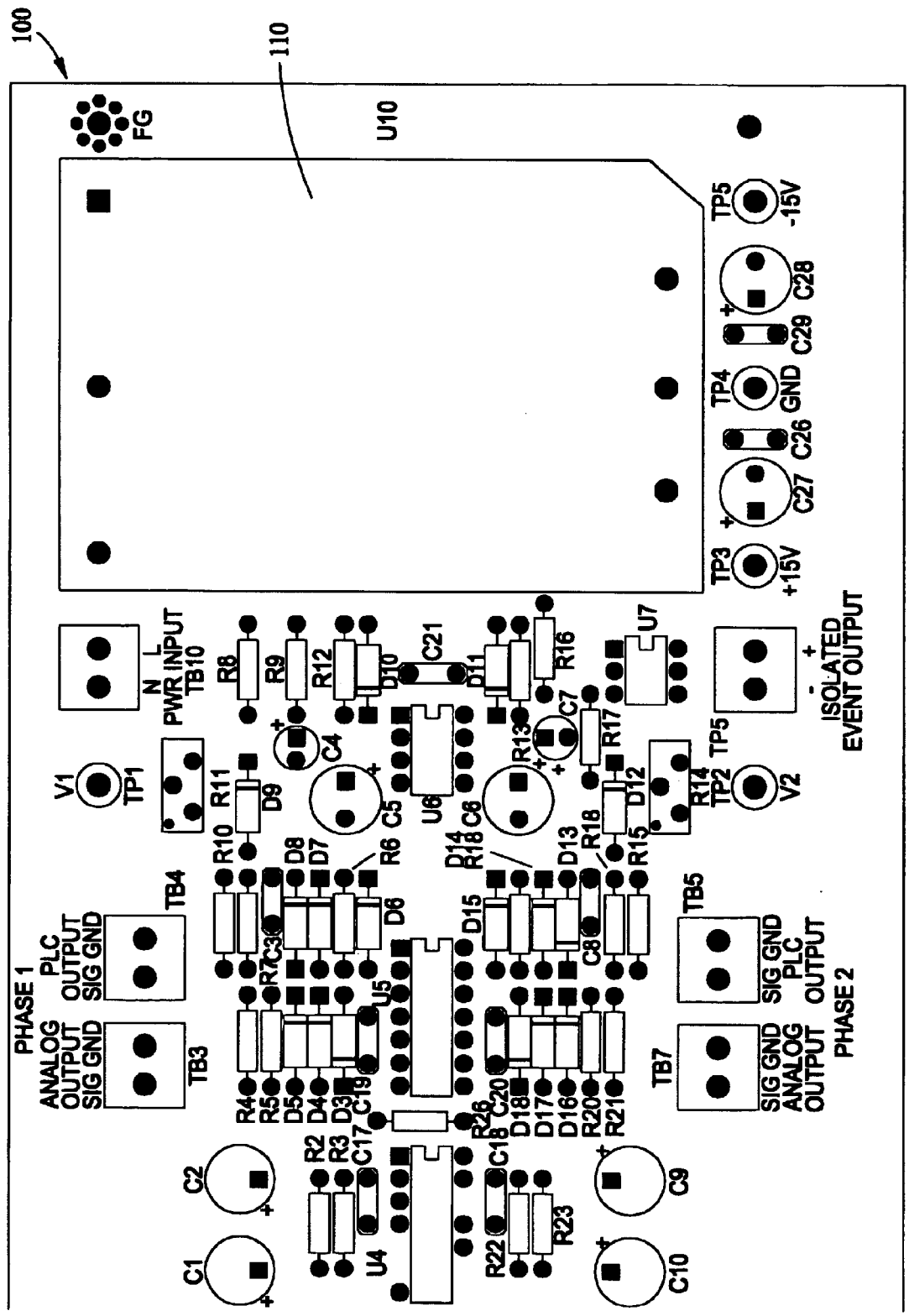
FIG. 4B is a second portion of an illustration of a printed circuit board layout that may be used to implement the schematic shown in FIG. 2.

FIG. 4 is an illustration of a printed circuit board layout that may be used to implement SCD 20 schematic (shown in FIG. 3). More specifically, SCD 20 is contained entirely on a printed circuit board (PCB) 100. In the exemplary embodiment, PCB 100 is mounted on a plurality of standoffs (not shown). PCB 100 is approximately 9.6 inches by 4.0 inches and includes approximately four mounting holes located in a rectangular arrangement. In one embodiment, the mounting holes are approximately 0.156 inches in diameter. In another embodiment PCB 100 is mounted in a PCB board channel that is approximately four inches wide. PCB 100 includes a power supply 110, and a plurality of electrical connections that are electrically coupled to a plurality of clamping terminal pairs that accept conductors that are between approximately #12 American Wire Gage (AWG) and #30 AWG. A connection point identification is located on PCB 100 adjacent to the connector pair. Although PCB 100 is described as using digital signal processing, in another embodiment, PCB 100 uses analog signal processing and therefore it is contemplated that the benefits of the invention accrue to all signal processing including both digital and analog signal processing.

Voltage inputs to PCB 100 are designed for one per unit line current to provide a 1.5 voltage root mean square (Vrms) signal. Current inputs are designed for 5 amperes (Arms) being equivalent to one per unit line current. Analog outputs 44 and 74 and analog DC outputs 48 and 78 are designed to interface with a plurality of electronic monitoring systems, such as system 18 (shown in FIG. 1), and support a monitoring system load up to approximately 100 k ohm, and approximately 1000 picofarads (pF) with a minimal decrease in accuracy.

Figure 5:
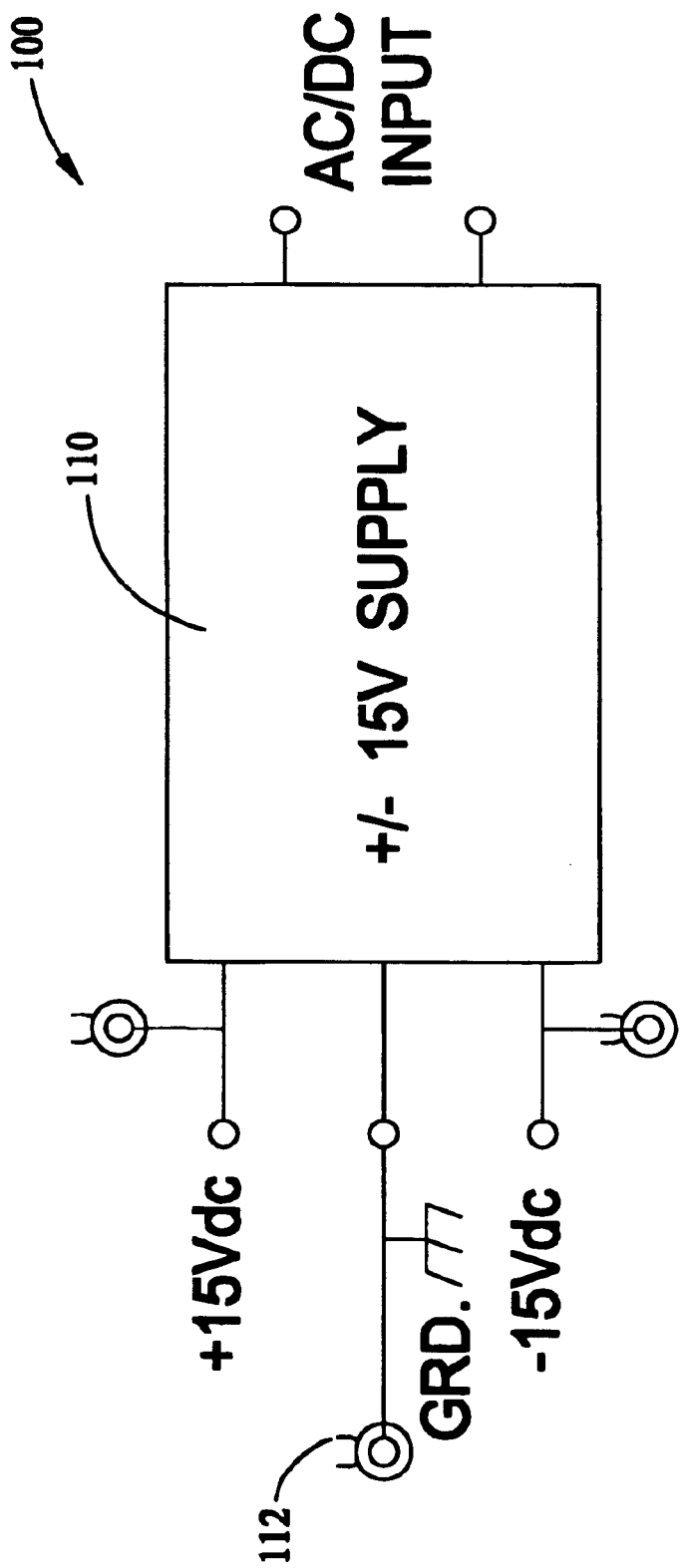
FIG. 5 is an illustration of a wiring connection of the printed circuit board shown in FIG. 3.

FIG. 5 is an illustration of a wiring connection diagram for PCB 100 circuitry power source. First phase detection circuit 22 (shown in FIG. 3) and second phase detection circuit 24 (shown in FIG. 3) are electrically coupled to common power supply 110 such that electrical isolation is provided for the positive fifteen volts and the negative fifteen volts utilized by SCD 20. Therefore, the plurality of current inputs 100 and 104 (shown in FIG. 3) and at least one event output 90 (shown in FIG. 3) are isolated from power supply 110. Voltage inputs 102 and 106, analog outputs 44 and 74, and PLC outputs 48 and 78, utilize a common ground 112, but are otherwise independent such that any single or combination of voltage or current inputs and outputs can be used.

In the exemplary embodiment, SCD 20 (shown in FIG. 3) can be configured to accept a plurality of subsynchronous current and voltage input parameters, such as, but not limited to a plurality of line frequencies, a subsynchronous frequency passband, a passband gain, and an input current range, by changing appropriate component values on PCB 100. Additionally, a plurality of precision components including low temperature coefficients are used throughout the signal paths to provide and maintain accuracy and reproducibility.

Table 1 illustrates a plurality of environmental characteristics of subsynchronous current detector 20. In use, subsynchronous current detector 20 is contained on a printed circuit card and may be designed to mount in a cabinet with other electronic equipment. The ranges specified in Table 1 are approximate ranges only, and are not shown to limit the novelty of subsynchronous current detector 20 as described herein.

TABLE 1

| Temperature Range, | Operating | 0 to 70 C. |
|---|---|---|
| | Storage | −25 to 85 C. |
| | Altitude | up to 1000 m |

Tables 2–4 illustrate the electrical characteristics of subsynchronous current detector 20. Specifically, Table 2 illustrates a plurality of supply requirement characteristics, Table 3 illustrates a plurality of input characteristics, and Table 4 illustrates a plurality of output characteristics. The ranges specified in Tables 2–4 are approximate ranges only, and are not shown to limit the novelty of subsynchronous current detector 20 as described herein.

TABLE 2

| Supply Requirements: | | | |
|---|---|---|---|
| Voltage, | AC | 47 to 440 Hz | 85 to 265 V |
| | DC | | 110 to 340 V |
| Power | | | 10 W |

TABLE 3

| Type | Linear region | Maximum |
|---|---|---|
| Voltage | up to 10 $V_{pk}$* | 12 $V_{pk}$, continuous |
| Current | up to 8 $A_{pk}$ | 12 $A_{pk}$, continuous |
| | | 60 $A_{rms}$, 100 msec |
| Isolation, input to output | | 3000 $V_{rms}$ |

*containing up to approximately 20 $Mv_{pk}$ of passband frequencies Outputs

TABLE 4

| | Outputs | |
|---|---|---|
| Type | Test Conditions | Value |
| Analog, AC | Voltage input, 59.5 to 60.5 Hz | 0.2 $V/V_{max}$ |
| | Current input, 59.5 to 60.5 Hz | 0.1 $mV/A_{max}$ |
| | Voltage input, 10 to 40 Hz | 0.565 V/mV |
| | Current input, 10 to 40 Hz | 0.170 V/mA |
| Analog, DC (PLC) | Voltage input, 59.5 to 60.5 Hz | 0.28 $V/V_{rms}$ max |
| | Current input, 59.5 to 60.5 Hz | 0.14 $V/A_{rms}$ max |
| | Voltage input, 10 to 40 Hz | 0.799 $V/mV_{rms}$ |
| Event Output | Analog DC threshold adjustment range | 0.1 to 10 V |
| | Maximum offstate voltage | ±300 V |
| | Maximum onstate resistance | 35 ohms |
| | Maximum current | 100 mA |
| | Isolation from circuit | 3750 $V_{rms}$ |

Table 5 illustrates the mechanical characteristics of subsynchronous current detector 20. The dimensions specified in Table 5 are approximate ranges dimensions only, and are not shown to limit the novelty of subsynchronous current detector 20 as described herein.

TABLE 5

| Dimensions | 4" W × 10" L × 1.25" H |
|---|---|
| Mounting | Four 6-32 clearance holes on 2.8" × 9.6" C/L or Hathaway Snaptrak[R] mounting |
| Inputs | 2 Voltage, 2 Current, 1 Power |
| Outputs | 2 Analog ac, 2 Analog dc, 1 Event |
| Connections | wire pressure clamp, #12 to #30 AWG |
| Test Points | 5@0.08" dia: V+, common, V−, 2 event thresholds |

Installing subsynchronous current detector 20 (shown in FIG. 2) proximate to series capacitor bank 14 (shown in FIG.

1) facilities identifying subsynchronous currents in a short amount of time. In one embodiment, SCD 20 identifies subsynchronous currents in less than approximately one second which allows an operator to modify capacitor bank 14 or remove series capacitor bank 14 from transmission system 10, thus ameliorating a shaft-line resonant coupling. Further, SCD 20 facilitates detecting appropriate levels of subsynchronous currents which are very low in magnitude compared to a nominal level of normal line frequency. For example, the ratio between the subsynchronous current and the line current at a probable required action level is approximately one part in one thousand. Additionally, SCD 20 provides an output that is compatible with the control and monitoring systems of both series capacitor bank 14 transmission system 10.

In another exemplary embodiment, SCD 20 may also be utilized at a generating station to assess the effect on generator 12 (shown in FIG. 1) of any specific series capacitor being switched on line. A variety of line conditions are continuously monitored with a DFR while line conditions change naturally, and the knowledge gained by monitoring is used for a more efficient and safer allocation of generating and transmission resources.

Although the invention has been described and illustrated in detail, it is to be clearly understood that the same is intended by way of illustration and example only and is not to be taken by way of limitation. In addition, the SCD described herein is an analog circuit processing circuit. Accordingly, the spirit and scope of the invention are not to be limited only by the terms of the claims, but to also encompass SCD's fabricated to use digital processing circuitry.

While the invention has been described in terms of various specific embodiments, those skilled in the art will recognize that the invention can be practiced with modification within the spirit and scope of the claims.

What is claimed is:

1. An apparatus for detecting currents in a three-phase power transmission system, said apparatus comprising:
    a first detection circuit electrically coupled to a first phase of said three-phase transmission system;
    a second detection circuit electrically coupled to a second phase of said three-phase transmission system different than said first phase; and
    an event output switch electrically coupled to said first detection circuit and said second detection circuit, said event output switch configured to actuate when a subsynchronous current on at least one of said first phase and said second phase exceeds a pre-selected subsynchronous current setpoint;
    wherein said first detection circuit comprises an alternating current analog output and a direct current analog output and said second detection circuit comprises an alternating current analog output and a direct current analog output.

2. An apparatus in accordance with claim 1 wherein at least one of the first detection circuit and the second detection circuit is electrically coupled to a series capacitor bank.

3. An apparatus in accordance with claim 1 wherein said event output switch is configured to actuate in less than approximately one second when a subsynchronous current is detected.

4. An apparatus in accordance with claim 1 wherein said pre-selected subsynchronous current setpoint is between approximately 17% and approximately 67% of a nominal line frequency.

5. An apparatus in accordance with claim 1 wherein said apparatus is operable using at least one of a plurality of line frequencies, a subsynchronous passband, a passband gain, and a variable current range.

6. An apparatus in accordance with claim 1 wherein said first detection circuit and said second detection circuit are operable using at least one of a current input and a voltage input.

7. An apparatus in accordance with claim 6 wherein said first detection circuit and said second detection circuit comprise a jumper switch configured to select at least one of said current input and said voltage input.

8. A series capacitor bank for a three-phase power transmission system, said capacitor bank comprising:
    a first detection circuit electrically coupled to a first phase of said three-phase transmission system;
    a second detection circuit electrically coupled to second phase of said three-phase transmission system different than said first phase; and
    an event output switch electrically coupled to said first detection circuit and said second detection circuit, said event output switch configured to actuate when a subsynchronous current on at least one of said first phase and said second phase exceeds a pre-selected subsynchronous current setpoint;
    wherein said first detection circuit and said second detection circuit are operable using at least one of a current input and a voltage input, said first detection circuit and said second detection circuit comprise a jumper switch configured to select at least one of said current input and said voltage input.

9. A series capacitor bank in accordance with claim 8 wherein said event output switch is configured to actuate in less than approximately one second when a subsynchronous current is detected.

10. A series capacitor bank in accordance with claim 8 wherein said pre-selected subsynchronous current setpoint is between approximately 15% and approximately 65% of a nominal line frequency.

11. A series capacitor bank in accordance with claim 8 wherein said first detection circuit comprises an alternating current analog output and a direct current analog output and said second detection circuit comprises an alternating current analog output and a direct current analog output.

12. A three-phase power transmission system, said transmission system comprising:
    a series capacitor bank;
    a first detection circuit electrically coupled to a first phase of said three-phase transmission system;
    a second detection circuit electrically coupled to second phase of said three-phase transmission system different than said first phase; and
    an event output switch electrically coupled to said first detection circuit and said second detection circuit, said event output switch configured to actuate when a subsynchronous current on at least one of said first phase and said second phase exceeds a pre-selected subsynchronous current setpoint at said series capacitor bank;
    wherein said first detection circuit comprises an alternating current analog output and a direct current analog output and said second detection circuit comprises an alternating current analog output and a direct current analog output.

13. A power transmission system in accordance with claim 12 wherein said event output switch is configured to actuate in less than approximately one second when a sub synchronous current is detected.

14. A power transmission system in accordance with claim 12 wherein said pre-selected subsynchronous current setpoint is between approximately 17% and approximately 67% of a nominal line frequency.

15. A power transmission system in accordance with claim 12 wherein said first detection circuit and said second detection circuit are operable using at least one of a current input and a voltage input.

16. A power transmission system in accordance with claim 15 wherein said first detection circuit and said second detection circuit comprise a jumper switch configured to select at least one of said current input and said voltage input.

\* \* \* \* \*